… … …

United States Patent [19]

Mathews et al.

[11] Patent Number: 5,208,479
[45] Date of Patent: May 4, 1993

[54] METHOD OF INCREASING CAPACITANCE OF POLYCRYSTALLINE SILICON DEVICES BY SURFACE ROUGHENING AND POLYCRYSTALLINE SILICON DEVICES

[75] Inventors: Viju Mathews; Charles Turner, both of Boise, Id.

[73] Assignee: Micron Technology, Inc., Boise, Id.

[21] Appl. No.: 883,186

[22] Filed: May 15, 1992

[51] Int. Cl.⁵ .................. H01L 27/02; H01L 21/203
[52] U.S. Cl. .................................. 257/534; 257/535; 257/309; 437/106; 437/233; 437/238; 437/162; 437/919
[58] Field of Search .................. 257/309, 534, 535; 437/106, 233, 162, 238, 919

[56] References Cited

U.S. PATENT DOCUMENTS 5,043,780  8/1991  Fazan et al. ..................... 257/534

Primary Examiner—Edward Wojciechowicz
Attorney, Agent, or Firm—Wells, St. John, Roberts, Gregory & Matkin

[57] ABSTRACT

A method of forming an electrically conductive polysilicon capacitor plate on a semiconductor substrate includes: a) providing a first layer of conductively doped polysilicon atop a semiconductor substrate to a first selected thickness; b) providing a thin layer of oxide atop the first polysilicon layer to a thickness of from about 2 Angstroms to about 30 Angstroms, the thin oxide layer having an outwardly exposed surface; and c) providing a second layer of conductively doped polysilicon having an outer exposed surface over the outwardly exposed thin oxide surface, the first polysilicon layer being electrically conductive with the second polysilicon layer through the thin layer of oxide, the second polysilicon layer having a second thickness from about 500 Angstroms to about 700 Angstroms, the thin oxide layer reducing silicon atom mobility during polysilicon deposition to induce roughness into the outer exposed polysilicon surface. Preferably, the polysilicon deposition, doping, oxide growth, and subsequent polysilicon deposition is all conducted in a single furnace sequence without removing the wafers from the furnace. Such facilitates throughput, and minimizes exposure of the wafer to handling which could lead to fatal damage. It is also contemplated that selected materials other than oxide would be usable to reduce the surface mobility, and thereby induce roughness. The invention also includes an electrically conductive polysilicon capacitor plate.

25 Claims, 2 Drawing Sheets

METHOD OF INCREASING CAPACITANCE OF POLYCRYSTALLINE SILICON DEVICES BY SURFACE ROUGHENING AND POLYCRYSTALLINE SILICON DEVICES

TECHNICAL FIELD

This invention relates to methods of increasing capacitance of polycrystalline silicon devices by surface roughening, and to polycrystalline silicon devices having increased capacitance.

BACKGROUND OF THE INVENTION

The reduction in memory cell sizes required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of a cell capacitor without significantly affecting the cell area. These include new structures utilizing trench and stacked capacitors, as well as the utilization of new capacitor dielectric materials having higher dielectric constants.

One common material utilized for the capacitor plates is conductively doped polysilicon. The prior art has recognized that the capacitance using such materials can be increased merely by increasing the surface roughness of the polysilicon film that is used as a storage node. Such roughness is typically transferred to the cell dielectric and polysilicon layer, resulting in a larger surface area for the same planar area that is available for the capacitor. One procedure utilized to achieve surface roughening involves deposition under conditions which are intended to inherently induce a rough or rugged upper polysilicon surface. Such techniques include low pressure chemical vapor deposition (LPCVD).

Such rugged polysilicon films additionally must be conductively doped after deposition. Such doping techniques include standard thermal phosphorus diffusion or ion implantation. These techniques require additional processing steps after rugged polysilicon film deposition. Each has also been observed to reduce the surface roughness of the film as a result of the doping, thereby reducing desired surface roughness leading to a lower gain in the capacitance per unit area.

Alternately, such polysilicon layers can be provided in two steps. A first underlying layer, perhaps deposited to a thickness of one-half the total desired layer, is deposited and heavily conductively doped with phosphorus. Thereafter, a second polysilicon film is deposited in a manner intended to induce roughness. The wafer is subsequently subjected to various processing steps which provide the added side effect of heating the wafer and causing conductivity impurity diffusion from the underlying layer to the upper layer. This alternate two-layer poly can include first depositing an undoped polysilicon layer. Thereafter, such layer is subjected to thermal phosphorus diffusion or ion implantation. In the course of such phosphorus diffusion, the wafer is typically subjected inadvertently to oxidizing conditions causing an undesired layer of oxide to be grown. Such oxide layer is typically at least 200 Angstroms thick, which is sufficient to create an effective insulating layer such that an undesired sub-capacitor would be formed within one of the storage nodes. Accordingly, the prior art completely removes this oxide layer by subjecting the wafer to a wet oxide strip, leaving an upwardly smooth polysilicon surface. With the oxide completely removed, a layer of undoped polysilicon is deposited. The wafer is subsequently subjected to heating steps which cause diffusion of conductivity enhancing impurity from the lower polysilicon layer to the upper polysilicon layer.

It would be desirable to improve upon these and other prior art techniques in developing electrically conductive polysilicon capacitor plates having enhanced capacitance for a given cell area.

BRIEF DESCRIPTION OF THE DRAWINGS

One or more preferred embodiments of the invention are illustrated in the following accompanying drawings.

DETAILED DESCRIPTION OF THE PREFERRED EMBODIMENTS

Figure 1:
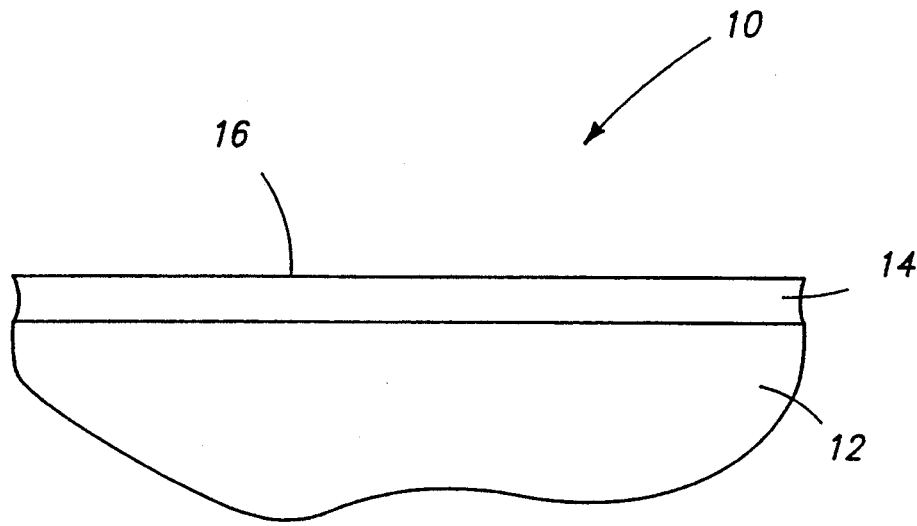
FIG. 1 is a diagrammatic sectional view of a semiconductor wafer fragment at a processing step in accordance with the invention.

This disclosure of the invention is submitted in furtherance of the constitutional purposes of the Patent Laws "to promote the progress of science and useful arts" (Article 1, Section 8).

In accordance with one aspect of the invention, a method of forming an electrically conductive polysilicon capacitor plate on a semiconductor substrate comprises the following steps:

providing a first layer of conductively doped polysilicon atop a semiconductor substrate to a first selected thickness;

providing a thin layer of oxide atop the first polysilicon layer to a thickness of from about 2 Angstroms to a maximum of about 30 Angstroms, the thin oxide layer having an outwardly exposed surface; and providing a second layer of conductively doped polysilicon having an outer exposed surface over the outwardly exposed thin oxide surface, the first polysilicon layer being electrically conductive with the second polysilicon layer through the thin layer of oxide, the second polysilicon layer having a thickness from about 500 Angstroms to about 700 Angstroms, the thin oxide layer reducing silicon atom mobility during polysilicon deposition to induce roughness into the outer exposed surface of the about 500 Angstrom to about 700 Angstrom second conductive polysilicon layer.

In accordance with another aspect of the invention, a method of forming an electrically conductive polysilicon capacitor plate on a semiconductor substrate comprises the following steps:

depositing and in situ conductively doping a first layer of polysilicon atop a semiconductor substrate to a first selected thickness;

providing a thin layer of oxide atop the first polysilicon layer to a thickness of from about 2 Angstroms to a maximum of about 30 Angstroms, the thin oxide layer having an outwardly exposed surface;

depositing a second layer of undoped polysilicon having an outer exposed surface over the outwardly exposed thin oxide surface, the second polysilicon layer having a thickness from about 500 Angstroms to about 700 Angstroms, the thin oxide layer reducing silicon atom mobility during polysilicon deposition to induce roughness into the outer exposed surface of the about 500 Angstrom to about 700 Angstrom second conductive polysilicon layer; and heating the semiconductor substrate to impart diffusion of conductivity enhancing impurity from the first polysilicon layer through the thin oxide layer to the second polysilicon layer to render the second polysilicon layer electrically conductive, the first polysilicon layer being electrically conductive with the second polysilicon layer through the thin layer of oxide.

In accordance with still a further aspect of the invention, a method of forming an electrically conductive polysilicon capacitor plate on a semiconductor substrate comprises the following steps:

in a semiconductor wafer processing furnace, providing a first layer of conductively doped polysilicon atop a semiconductor wafer to a first selected thickness;

without removing the substrate from the semiconductor wafer processing furnace, exposing the wafer in the furnace to oxidizing conditions to grow a thin layer of silicon dioxide atop the first polysilicon layer to a thickness of from about 2 Angstroms to a maximum of about 30 Angstroms, the thin silicon dioxide layer having an outwardly exposed surface;

without removing the wafer from the semiconductor wafer processing furnace after growth of the thin layer of silicon dioxide, providing a second layer of polysilicon having an outer exposed surface over the outwardly exposed thin oxide surface, the second polysilicon layer having a thickness from about 500 Angstroms to about 700 Angstroms, the thin oxide layer reducing silicon atom mobility during polysilicon deposition to induce roughness into the outer exposed surface of the about 500 Angstrom to about 700 Angstrom second conductive polysilicon layer; and rendering the second polysilicon layer electrically conductive, the first polysilicon layer being electrically conductive with the second polysilicon layer through the thin layer of oxide.

In accordance with still a further aspect of the invention, an electrically conductive polysilicon capacitor plate on a semiconductor substrate comprises:

a first layer of conductively doped polysilicon having a first selected thickness;

a thin layer of oxide atop the first polysilicon layer having a thickness of from about 2 Angstroms to a maximum of about 30 Angstroms, the thin oxide layer having an outer surface; and a second layer of conductively doped polysilicon atop the thin oxide layer, the second polysilicon layer having a thickness from about 500 Angstroms to about 700 Angstroms, the first polysilicon layer being electrically conductive with the second polysilicon layer through the thin layer of oxide, the second polysilicon layer having an outer surface with roughness induced by the thin oxide layer.

More specifically and with reference to the figures, FIG. 1 illustrates a semiconductor wafer fragment 10 comprised of a bulk substrate 12. A first layer 14 of polysilicon is provided atop semiconductor substrate 12 to a first selected thickness. The selected thickness of layer 14 is of no known significance to the invention, with an example of 600 Angstroms being adequate. First polysilicon layer 14 can be rendered electrically conductive by a thermal phosphorus diffusion or ion implantation to produce a preferred impurity implant concentration of about $1 \times 10^{19}$ atoms/cm$^3$. Alternately and preferably, layer 14 is deposited and in situ conductively doped during the depositing.

An example technique would be to utilize a Silicon Valley Group (SVG) vertical furnace which typically includes three elevationally displaced gas injectors. Such an example technique using such equipment would feed silane (SiH$_4$) and phosphine (PH$_3$) at a volumetric ratio of silane to phosphine of 20:1, a temperature of 535° C., and a total pressure of 200 mTorr. Such will produce a conductively doped polysilicon layer at a rate of approximately 10 to 12 Angstroms per minute having a resultant concentration of $1 \times 10^{19}$ atoms/cm$^3$. A specific example would include, a) top injector feed of 300 sccm SiH$_4$, 15 sccm PH$_3$; b) center injector feel of 98.5 sccm SiH$_4$, 5 sccm PH$_3$; and c) a bottom injector feed of 97.5 sccm SiH$_4$, 5 sccm PH$_3$. Such will produce the illustrated poly layer 14 having a smooth upper surface 16. A similar technique could be utilized with an arsine (ASH$_3$) feed.

Figure 2:
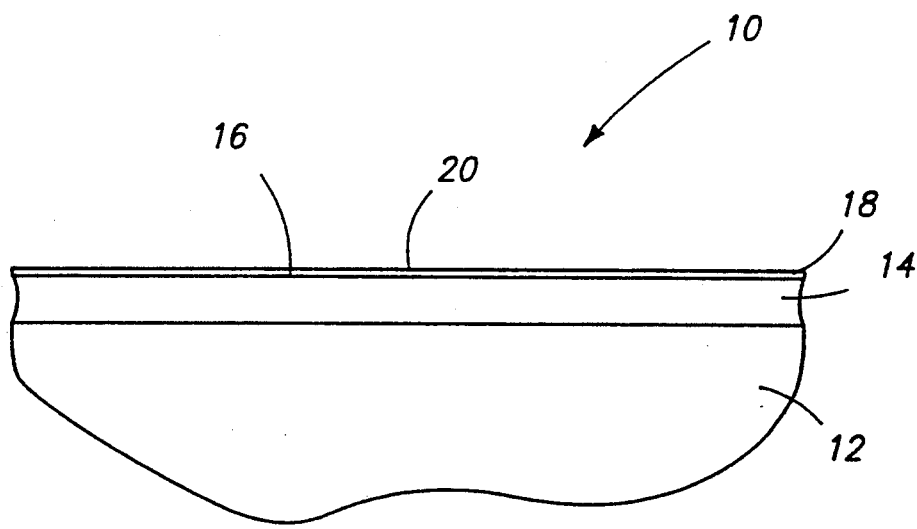
FIG. 2 is a view of the FIG. 1 wafer at a processing step subsequent to that shown by FIG. 1.

Referring to FIG. 2, a thin layer 18 of oxide is provided atop upper surface 16 of first polysilicon layer 14 to a thickness of from about 2 Angstroms to about 30 Angstroms. Most preferably, oxide layer 18 has a thickness of from about 5 Angstroms to about 15 Angstroms. Thin oxide layer 18 has an outwardly exposed surface 20. The preferred technique for generating thin oxide layer 18 is by exposing wafer fragment 10 to an oxidizing atmosphere to oxidize polysilicon of layer 14 to produce SiO$_2$. For example, exposing the wafer of FIG. 1 to air for approximately 20 minutes under ambient conditions will produce a layer of oxide having a thickness from about 10 Angstroms to about 15 Angstroms. Most preferably for process efficiency, wafer 10 is exposed to an oxidizing atmosphere within the semiconductor wafer processing furnace without having removed the wafer from the processing furnace subsequent to the deposition of polysilicon layer 14.

The most preferred oxidizing atmosphere comprises N$_2$O. It has been determined that exposing wafers such as shown in FIG. 1 to a pure atmosphere of N$_2$O results in a self-limiting growth of an oxide film 18 having a maximum thickness of 20 Angstroms. It is not fully understood why such process is self-limiting. However, it is theorized that the N$_2$O and polysilicon of layer 18 produce a thin layer of a nitride or nitride-like material between the polysilicon and growing oxide, thereby limiting the silicon consumption and thereby the oxide growth. Note that a thicker oxide layer 18 might be deposited and subsequently etched back to provide a thin layer of oxide having a thickness of from about 2 Angstroms to about 30 Angstroms without departing from the principles and scope of the invention.

Figure 3:
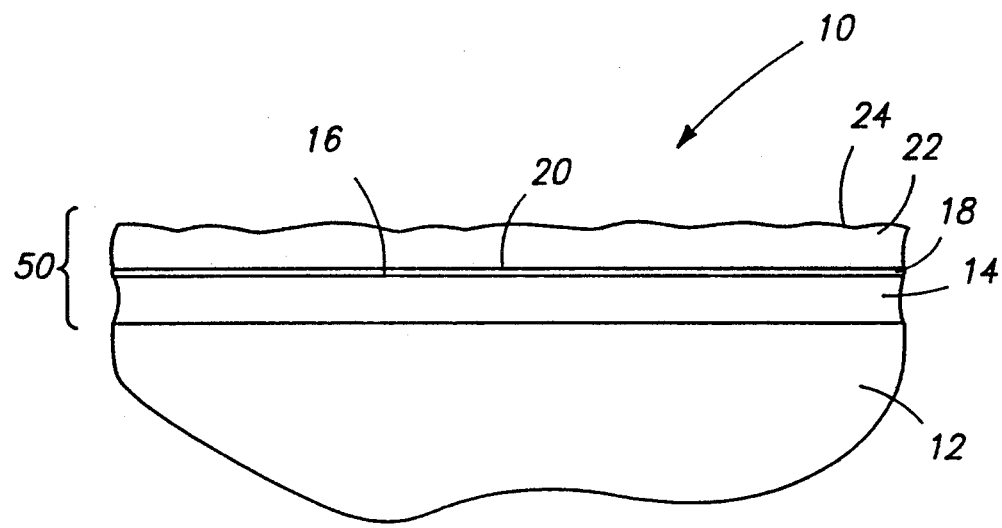
FIG. 3 is a view of the FIG. 1 wafer at a processing step subsequent to that shown by FIG. 2.

Referring to FIG. 3, a second layer 22 of polysilicon is deposited to a second thickness over outwardly exposed oxide upper surface 20. For purposes of the continuing discussion, polysilicon layer 22 has an outer exposed surface 24. The second thickness of layer 22 is from about 500 Angstroms to about 700 Angstroms, with about 600 Angstroms being preferred. The thin layer of oxide functions to reduce silicon atom mobility during polysilicon deposition to induce roughness into outer exposed surface 24. However to effectively do so, the thickness of layer 22 should not be so great as to produce an upper surface 24 which is smooth. Alternately and for unknown reasons, providing too thin a layer 22 can result in an upper surface 24 which is not roughened the result of oxide layer 18. The operable thickness range has been determined to be from about 500 Angstroms to about 700 Angstroms to reduce surface mobility for enhancing roughness.

Preferably, polysilicon layer 22 as deposited is undoped, and is provided within the same furnace without there having been any preceding removal of the wafers from the furnace subsequent to providing first polysilicon layer 14 and oxide layer 18. Also preferably, polysilicon layer 22 is grown under conditions which produce grain sizes having diameters of 800 to 1000 Angstroms, with 70 to 100 grains per square micron being preferred. An example technique utilizing the SVG furnace would be to operate at a temperature of 555° C., a pressure of 100 mTorr, $SiH_4$ feed at 51 sccm from the top injector and 33 sccm from the bottom injector, with no feed from the middle injector. Pressure would be regulated by a throttling valve.

During subsequent conventional or typical semiconductor processing steps, semiconductor substrate 10 will be heated to a temperature sufficient to impart diffusion of conductivity enhancing impurity from first polysilicon layer 14 through thin oxide layer 18 to second polysilicon layer 22 to render second polysilicon layer 22 electrically conductive. An example temperature to induce sufficient diffusion would be 850° C. for 30 minutes.

Oxide layer 18 is kept sufficiently thin (less than about 30 Angstroms) such that first polysilicon layer 14 is electrically conductive with second polysilicon layer 22 through thin oxide layer 18 without any significant insulating barrier or capacitor being formed between layers 14 and 22. Thus, FIG. 3 illustrates a lower capacitor plate 50 having been formed.

Figure 4:
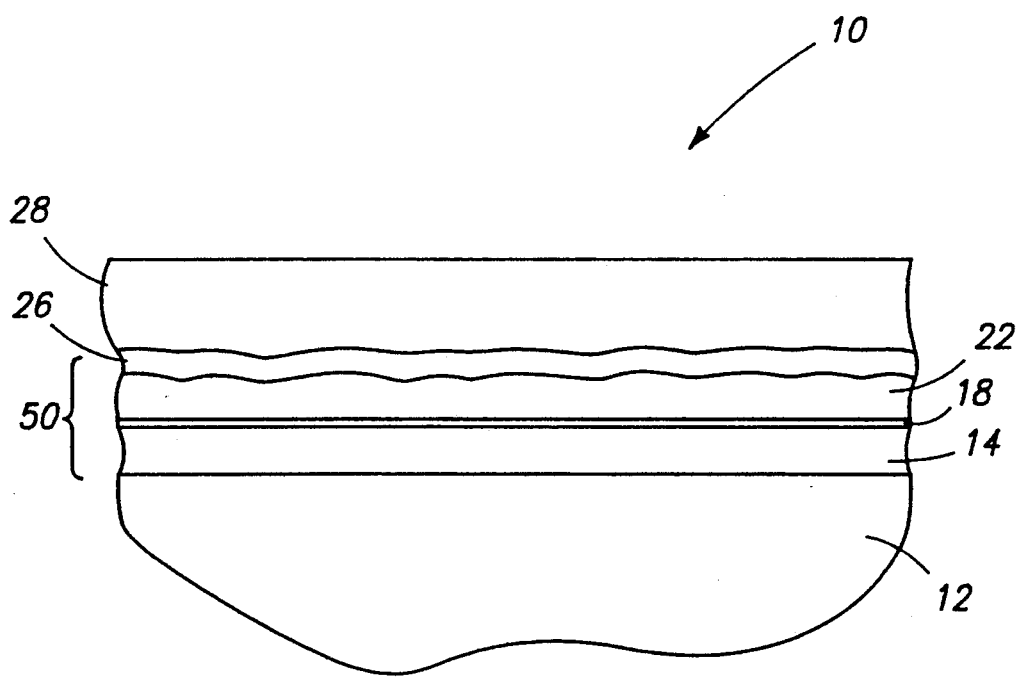
FIG. 4 is a view of the FIG. 1 wafer at a processing step subsequent to that shown by FIG. 3.

Referring to FIG. 4, a subsequent capacitor dielectric layer 26 is deposited, followed by a second storage capacitor plate 28 to complete formation of a capacitor. Although the above illustrated and described technique was with respect to formation of a planar capacitor; stacked, trenched or other capacitors could be formed in accordance with the invention.

Providing such a thin oxide film in accordance with the invention is believed to affect the surface mobility of silicon atoms, thereby inducing roughness at the surface. Experiments as above were conducted however wherein no intervening thin oxide layer was produced. Such resulted in smooth upper polysilicon surfaces. However, wafers produced in accordance with the above-described invention produced a very significant roughened upper polysilicon surface. Preferably as described above, the polysilicon deposition, doping, oxide growth, and subsequent polysilicon deposition is all conducted in a single furnace sequence without removing the wafers from the furnace. Such facilitates throughput, and minimizes exposure of the wafer to handling which could lead to fatal damage.

It is also contemplated that selected materials other than oxide would be usable to reduce the surface mobility, and thereby induce roughness. Such materials and their associated thicknesses (still less than about 30 Angstroms) would most preferably be selected to both, a) reduce silicon atom mobility of a 500 to 700 Angstrom thick deposited polysilicon layer, and b) enable dopant diffusion therethrough to render the 500 to 700 Angstrom thick layer electrically conductive. One example alternate material would be arsenic.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming an electrically conductive polysilicon capacitor plate on a semiconductor substrate comprising the following steps:
   providing a first layer of conductively doped polysilicon atop a semiconductor substrate to a first selected thickness;
   providing a thin layer of oxide atop the first polysilicon layer to a thickness of from about 2 Angstroms to a maximum of about 30 Angstroms, the thin oxide layer having an outwardly exposed surface; and
   providing a second layer of conductively doped polysilicon having an outer exposed surface over the outwardly exposed thin oxide surface, the first polysilicon layer being electrically conductive with the second polysilicon layer through the thin layer of oxide, the second polysilicon layer having a thickness from about 500 Angstroms to about 700 Angstroms, the thin oxide layer reducing silicon atom mobility during polysilicon deposition to induce roughness into the outer exposed surface of the about 500 Angstrom to about 700 Angstrom second conductive polysilicon layer.

2. The method of forming an electrically conductive polysilicon capacitor plate of claim 1 wherein the thin layer of oxide has a thickness of from about 5 Angstroms to about 15 Angstroms.

3. The method of forming an electrically conductive polysilicon capacitor plate of claim 1 wherein the thin layer of oxide is provided by exposing the wafer to an oxidizing atmosphere to oxidize polysilicon to $SiO_2$.

4. The method of forming an electrically conductive polysilicon capacitor plate of claim 3 wherein the oxidizing atmosphere comprises $N_2O$.

5. The method of forming an electrically conductive polysilicon capacitor plate of claim 1 wherein the step of providing a second layer of conductively doped polysilicon comprises depositing a layer of undoped polysilicon and thereafter heating the semiconductor substrate to impart diffusion of conductivity enhancing impurity from the first polysilicon layer through the thin oxide layer to the second polysilicon layer to render the second polysilicon layer electrically conductive.

6. The method of forming an electrically conductive polysilicon capacitor plate of claim 1 wherein the step of providing a first layer of conductively doped polysilicon comprises simultaneously depositing and in situ conductively doping polysilicon.

7. A product produced by the process of claim 1.

8. A method of forming an electrically conductive polysilicon capacitor plate on a semiconductor substrate comprising the following steps:
   depositing and in situ conductively doping a first layer of polysilicon atop a semiconductor substrate to a first selected thickness;

providing a thin layer of oxide atop the first polysilicon layer to a thickness of from about 2 Angstroms to a maximum of about 30 Angstroms, the thin oxide layer having an outwardly exposed surface;

depositing a second layer of undoped polysilicon having an outer exposed surface over the outwardly exposed thin oxide surface, the second polysilicon layer having a thickness from about 500 Angstroms to about 700 Angstroms, the thin oxide layer reducing silicon atom mobility during polysilicon deposition to induce roughness into the outer exposed surface of the about 500 Angstrom to about 700 Angstrom second conductive polysilicon layer; and heating the semiconductor substrate to impart diffusion of conductivity enhancing impurity from the first polysilicon layer through the thin oxide layer to the second polysilicon layer to render the second polysilicon layer electrically conductive, the first polysilicon layer being electrically conductive with the second polysilicon layer through the thin layer of oxide.

9. The method of forming an electrically conductive polysilicon capacitor plate of claim 8 wherein the thin layer of oxide has a thickness of from about 5 Angstroms to about 15 Angstroms.

10. The method of forming an electrically conductive polysilicon capacitor plate of claim 8 wherein the thin layer of oxide is provided by exposing the wafer to an oxidizing atmosphere to oxidize polysilicon to $SiO_2$.

11. The method of forming an electrically conductive polysilicon capacitor plate of claim 10 wherein the oxidizing atmosphere comprises $N_2O$.

12. A product produced by the process of claim 8.

13. A method of forming an electrically conductive polysilicon capacitor plate on a semiconductor substrate comprising the following steps:

in a semiconductor wafer processing furnace, providing a first layer of conductively doped polysilicon atop a semiconductor wafer to a first selected thickness;

without removing the substrate from the semiconductor wafer processing furnace, exposing the wafer in the furnace to oxidizing conditions to grow a thin layer of silicon dioxide atop the first polysilicon layer to a thickness of from about 2 Angstroms to a maximum of about 30 Angstroms, the thin silicon dioxide layer having an outwardly exposed surface;

without removing the wafer from the semiconductor wafer processing furnace after growth of the thin layer of silicon dioxide, providing a second layer of polysilicon having an outer exposed surface over the outwardly exposed thin oxide surface, the second polysilicon layer having a thickness from about 500 Angstroms to about 700 Angstroms, the thin oxide layer reducing silicon atom mobility during polysilicon deposition to induce roughness into the outer exposed surface of the about 500 Angstrom to about 700 Angstrom second conductive polysilicon layer; and rendering the second polysilicon layer electrically conductive, the first polysilicon layer being electrically conductive with the second polysilicon layer through the thin layer of oxide.

14. The method of forming an electrically conductive polysilicon capacitor plate of claim 13 wherein the thin layer of silicon dioxide has a thickness of from about 5 Angstroms to about 15 Angstroms.

15. The method of forming an electrically conductive polysilicon capacitor plate of claim 13 wherein the oxidizing conditions comprise an $N_2O$ atmosphere.

16. A product produced by the process of claim 13.

17. An electrically conductive polysilicon capacitor plate on a semiconductor substrate comprising:

a first layer of conductively doped polysilicon having a first selected thickness;

a thin layer of oxide atop the first polysilicon layer having a thickness of from about 2 Angstroms to a maximum of about 30 Angstroms, the thin oxide layer having an outer surface; and a second layer of conductively doped polysilicon atop the thin oxide layer, the second polysilicon layer having a thickness from about 500 Angstroms to about 700 Angstroms, the first polysilicon layer being electrically conductive with the second polysilicon layer through the thin layer of oxide, the second polysilicon layer having an outer surface with roughness induced by the thin oxide layer.

18. The electrically conductive polysilicon capacitor plate of claim 17 wherein the thin layer of oxide has a thickness of from about 5 Angstroms to about 15 Angstroms.

19. A method of forming an electrically conductive polysilicon capacitor plate on a semiconductor substrate comprising the following steps:

providing a conductively doped first layer of polysilicon atop a semiconductor substrate to a first selected thickness;

providing a thin layer of selected material atop the first polysilicon layer to a thickness of less than about 30 Angstroms, the selected material layer having an outwardly exposed surface, the selected material comprising something other than polysilicon;

depositing a second layer of undoped polysilicon having an outer exposed surface over the outwardly exposed selected material surface, the second polysilicon layer having a thickness from about 500 Angstroms to about 700 Angstroms, the material of the selected material layer reducing silicon atom mobility during polysilicon deposition to induce roughness into the outer exposed surface of the about 500 Angstrom to about 700 Angstrom second conductive polysilicon layer; and heating the semiconductor substrate to impart diffusion of conductivity enhancing impurity from the first polysilicon layer through the selected material layer to the second polysilicon layer to render the second polysilicon layer electrically conductive, the first polysilicon layer being electrically conductive with the second polysilicon layer through the thin layer of selected material.

20. The method of forming an electrically conductive polysilicon capacitor plate of claim 19 wherein the thin layer of selected material has a thickness of from about 5 Angstroms to about 15 Angstroms.

21. A product produced by the process of claim 19.

22. The method of forming an electrically conductive polysilicon capacitor plate of claim 19 wherein the thin layer of selected material comprises arsenic.

23. An electrically conductive polysilicon capacitor plate on a semiconductor substrate comprising:

a first layer of conductively doped polysilicon having a first selected thickness;

a thin layer of a selected material atop the first polysilicon layer having a thickness of from about 2 Angstroms to a maximum of about 30 Angstroms, the selected material layer having an outer surface, the selected material being comprising something other than polysilicon; and a second layer of conductively doped polysilicon atop the thin selected material layer, the second polysilicon layer having a thickness from about 500 Angstroms to about 700 Angstroms, the first polysilicon layer being electrically conductive with the second polysilicon layer through the thin selected material layer, the second polysilicon layer having an outer surface with roughness induced by the thin selected material layer.

24. The electrically conductive polysilicon capacitor plate of claim 23 wherein the thin layer of selected material has a thickness of from about 5 Angstroms to about 15 Angstroms.

25. The electrically conductive polysilicon capacitor plate of claim 23 wherein the thin layer of selected material comprises arsenic.

* * * * *